(12) United States Patent
Nazarian

(10) Patent No.: US 7,149,100 B2
(45) Date of Patent: *Dec. 12, 2006

(54) SERIAL TRANSISTOR-CELL ARRAY ARCHITECTURE

(75) Inventor: Hagop A. Nazarian, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/314,722

(22) Filed: Dec. 22, 2005

(65) Prior Publication Data

US 2006/0126378 A1 Jun. 15, 2006

Related U.S. Application Data

(63) Continuation of application No. 10/699,652, filed on Nov. 4, 2003, now Pat. No. 7,064,970.

(51) Int. Cl.
*G11C 27/00* (2006.01)

(52) U.S. Cl. .......................... 365/46; 365/100; 365/148

(58) Field of Classification Search .................. 365/46, 365/100, 148
See application file for complete search history.

(56) References Cited

U.S. PATENT DOCUMENTS

| 6,348,365 B1 | 2/2002 | Moore et al. |
|---|---|---|
| 6,356,477 B1 | 3/2002 | Tran |
| 6,358,756 B1 | 3/2002 | Sandhu et al. |
| 6,445,612 B1 | 9/2002 | Naji |

(Continued)

FOREIGN PATENT DOCUMENTS

| EP | 1426 966 A2 | 9/2004 |
|---|---|---|

OTHER PUBLICATIONS

M. Durlam, et al., "A Low Power 1Mbit MRAM based on 1T1MTJ Bit Cell Integrated With Copper Interconnects", 2002 Symposium on VLSI Circuits Digest of Technical Papers; Mar. 2, 2002.

(Continued)

*Primary Examiner*—Tan T. Nguyen
(74) *Attorney, Agent, or Firm*—Dickstein Shapiro LLP

(57) ABSTRACT

A memory array architecture suitable for variable resistance memory that mitigates sneak path and associated problems by limiting the number of memory cells associated with an addressed cell to a known number having a sneak path resistance that can be calculated and taken into consideration when sensing the addressed memory cell. Blocks of memory cells are associated with access transistors, which separate the memory cells connected thereto into one half (½) sections of cell blocks. The access transistors can be associated with n memory cells, where n is an even number of at least 2; there may or may not be an equal number of cells on either side of the transistor. The memory array has memory cells, which are grouped into 1T-2nCell blocks.

18 Claims, 8 Drawing Sheets

U.S. PATENT DOCUMENTS

| | | |
|---|---|---|
| 6,757,189 B1 | 6/2004 | Hung et al. |
| 6,985,376 B1 * | 1/2006 | Matsuoka .................. 365/148 |
| 7,016,222 B1 * | 3/2006 | Morikawa .................. 365/158 |
| 7,064,970 B1 * | 6/2006 | Nazarian ..................... 365/46 |
| 2001/0012228 A1 | 8/2001 | Perner |
| 2002/0039308 A1 | 4/2002 | Gogl et al. |
| 2002/0159317 A1 | 10/2002 | Lammers et al. |
| 2002/0176272 A1 | 11/2002 | DeBrosse et al. |
| 2002/0196647 A1 | 12/2002 | Nickel |
| 2003/0058685 A1 | 3/2003 | Tran et al. |
| 2004/0100835 A1 | 5/2004 | Sugibayashi et al. |

OTHER PUBLICATIONS

R. Desikan, et al., "On-Chip MRAM as a High-Bandwidth, Low-Latency Replacement for DRAM Physical Memories", Department of Computer Sciences, Tech Report TR-02-47, University of Texas at Austin, Sep. 27, 2002.

James Daughton, Magnetoresistive Random Access Memory (MRAM), Feb.24, 2000 (contact Arthur at daughton@nic.com).

R. Butner, "Computing Unplugged", http://www.research.ibm.com/thinkresearch/pages/2001/20010202_mram.shtml; visited Apr. 7, 2003.

* cited by examiner

US 7,149,100 B2

SERIAL TRANSISTOR-CELL ARRAY ARCHITECTURE

This application is a continuation of application Ser. No. 10/699,652, filed on Nov. 4, 2003 now U.S. Pat. No. 7,064,970, which is hereby incorporated by reference in its entirety.

FIELD OF THE INVENTION

The invention relates to memory structures utilizing variable resistance states for data storage and to an architecture for such structures incorporating a serial configuration.

BACKGROUND

Integrated circuit designers have always sought the ideal semiconductor memory: a device that is randomly accessible, can be written or read very quickly, is non-volatile, but indefinitely alterable, and consumes little power. Emerging variable resistance memories increasingly offer these advantages. Programmable Conductance Random Access Memory (PCRAM) is one example of such a memory. Additionally, Magnetoresistive Random Access Memory (MRAM) technology has been increasingly viewed as offering all these advantages. Other types of variable resistance memories include polymer-based memory and chalcogenide-based memory.

A PCRAM element has a structure including a chalcogenide-based glass region incorporating a metal (or metal ions) and electrodes on either side of the glass region. Information can be stored as a digital "1" or "0" as stable resistance states. A typical chalcogenide glass used in PCRAM devices is $Ge_xSe_{100-x}$. The chalcogenide glass can also be used in conjunction with layers of Ag and/or $Ag_2Se$. An example of a PCRAM device is described in U.S. Pat. No. 6,348,365 to Moore and Gilton. The glass region of a PCRAM element can be made less resistive upon application of a threshold voltage. This less resistive state is maintained in a non- or semi-volatile manner and is reversible by applying a reversed voltage. The resistance state of a PCRAM element can be sensed by the application of a sub-threshold voltage through the cell element.

A magnetic memory element has a structure which includes ferromagnetic layers separated by a non-magnetic barrier layer that forms a tunnel junction. An example of an MRAM device is described in U.S. Pat. No. 6,358,756 to Sandhu et al. Information can be stored as a digital "1" or a "0" as directions of magnetization vectors in these ferromagnetic layers. Magnetic vectors in one ferromagnetic layer are magnetically fixed or pinned, while the magnetic vectors of the other ferromagnetic layer are not fixed so that the magnetization direction is free to switch between "parallel" and "antiparallel" states relative to the pinned layer. In response to parallel and antiparallel states, the magnetic memory element represents two different stable resistance states, which are read by the memory circuit as either a "1" or a "0." Passing a current through the MRAM cell enables detection of the resistance states.

As mentioned above, polymer memory, another type of variable resistance memory, utilizes a polymer-based layer having ions dispersed therein or, alternatively, the ions may be in an adjacent layer. The polymer memory element is based on polar conductive polymer molecules. The polymer layer and ions are between two electrodes such that upon application of a voltage or electric field the ions migrate toward the negative electrode, thereby changing the resistivity of the memory cell. This altered resistivity can be sensed as a memory state.

Chalcogenide memory, another type of variable resistance memory, switches resistivity states by undergoing a phase change in response to resistive heating. The two phases corresponding to the two stable resistivity states include a polycrystalline state and an amorphous state. The amorphous state is a higher resistive state, which can be read as stored data.

A problem encountered in variable resistance memory array architectures, particularly MRAM, is the generation of sneak paths. Sneak paths during read operations are most prevalent in cross-point array architectures, but exist wherever memory cells are in direct electrical contact with one another through the array. A sneak path is a parasitic path or logic flow within a system which, under certain conditions, can initiate an undesired function or inhibit a desired function. Typically, in variable resistance memory circuits the problem is exhibited when reading data from a desired cell. Other cells in electrical contact with the addressed cell provide alternate routes for current, causing a sneak path and lowering the memory circuit's resistance to potentially unreadable levels.

A typical prior art variable resistance memory array 10, here discussed as an MRAM array, is shown in FIG. 1a. MRAM cells 12 are located and addressed at the intersecting points of bit lines 16 (also called column lines) and wordlines 18 (also called row lines). When the cell 12 to be read is addressed by grounding the wordline 18 and forcing a current on the bit line 16, the addressed cell 12 exhibits a resistivity based on its programmed state, which can be sensed by sense circuitry 14. However, parasitic current also flows through other non-addressed cells 12a of the array 10 in multiple sneak paths across the array 10. These sneak paths reduce the total resistivity of the cell 12 being sensed by the sense circuitry 14. With the diminished resistance there is a smaller margin between the programmed higher and lower resistive states of the memory cell 12, making the memory more difficult to read.

The sneak path effect on the addressed MRAM cell 12 of FIG. 1a is illustrated by the circuit diagram of FIG. 1b. As shown, the sneak path equivalent resistance 20, which is an equivalent sum of the resistances of the memory cells of the sneak path, provides an alternate route for current in the array architecture when the selected cell 12 is being sensed. Thus, the sneak path creates an effective parallel current path. In the array 10 shown in FIG. 1a, each of the bit lines 16 have an applied voltage. Thus, the entire array provides a sneak path as the memory cells 12a provide shorts between the bit lines 16 and wordlines 18. Such a sneak path makes for a relatively low resistance circuit, which makes read operations difficult. The resistance value at the bit line 16 due to sneak path influence can be described as approximately:

$$R_{sneak} = R/m - 1 \qquad (1)$$

where R is the combined resistance of memory cells (e.g., 12a) and m is the total number of wordlines 18 or rows.

It would be advantageous to have a memory array architecture suitable for a variable resistance memory array that could provide similar integration characteristics as a cross-point array architecture, but which would also mitigate the detriments of sneak path occurrence.

SUMMARY

The invention relates to an architecture suitable for variable resistance memory that addresses the above-discussed problems of the prior art. The invention mitigates sneak path and associated problems in memory array architectures by limiting the number of memory cells associated with an addressed cell to a known number having a sneak path resistance that can be calculated and taken into consideration when sensing the addressed memory cell. Blocks of memory cells are associated with access transistors, which separate the memory cells connected thereto into one-half (½) sections of cell blocks. The access transistors can be associated with n memory cells, where there may or may not be an equal number of cells (n) on either side of the transistor. The memory array has memory cells, which, for example, may be grouped into 1T-2nCell blocks. "1T-2nCell" indicates that there is an even number (2n) of memory cells per transistor for each block, where n memory cells are on each side of the transistor. The resistance of the sneak path(s) can be calculated and factored into the read operation. The memory array architecture provides a higher resistance sneak path as well as producing less noise and enabling a reasonably high level of integration, which may include multiple memory array layers.

These and other advantages and features of the present invention will be more apparent from the following detailed description and drawings which illustrate various embodiments of the invention.

BRIEF DESCRIPTION OF THE DRAWINGS

FIG. 1b is a schematic representation of an equivalent circuit of the sneak path occurrence of the prior art array illustrated in FIG. 1a;

FIG. 4b is a schematic representation of a memory array circuit as shown in FIG. 3 or 4a.

DETAILED DESCRIPTION

In the following detailed description, reference is made to various specific embodiments in which the invention may be practiced. These embodiments are described with sufficient detail to enable those skilled in the art to practice the invention, and it is to be understood that other embodiments may be employed, and that structural and electrical changes may be made without departing from the spirit or scope of the present invention.

This invention relates to a novel array architecture for memory technology, particularly variable resistance memory with low volatility (termed "non-volatile" in the art), requiring little or no refreshing, such as MRAM, PCRAM, polymer memory, and chalcogenide-based memory. It is also possible that the memory array architecture of the invention can be used with other types of memory as well, so long as such memory may benefit from the mitigation of sneak path. Typical memory cell types with which the invention can be utilized are two terminal structures; however, more than two terminals can be used also.

The invention mitigates problems associated with memory array architecture sneak path by limiting the number of memory cells associated (by potential electrical connection) with an addressed cell to a known number having a sneak path resistance that can be calculated and taken into consideration when sensing the addressed memory cell. Blocks of memory cells are associated with access transistors, which separate the memory cells associated with the transistor into one-half (½) sections of cell blocks. The access transistors can be associated with n memory cells, where n is at least 2. The one-half sections need not necessarily be symmetrical or consist of equal numbers of memory cells.

Figure 1A:
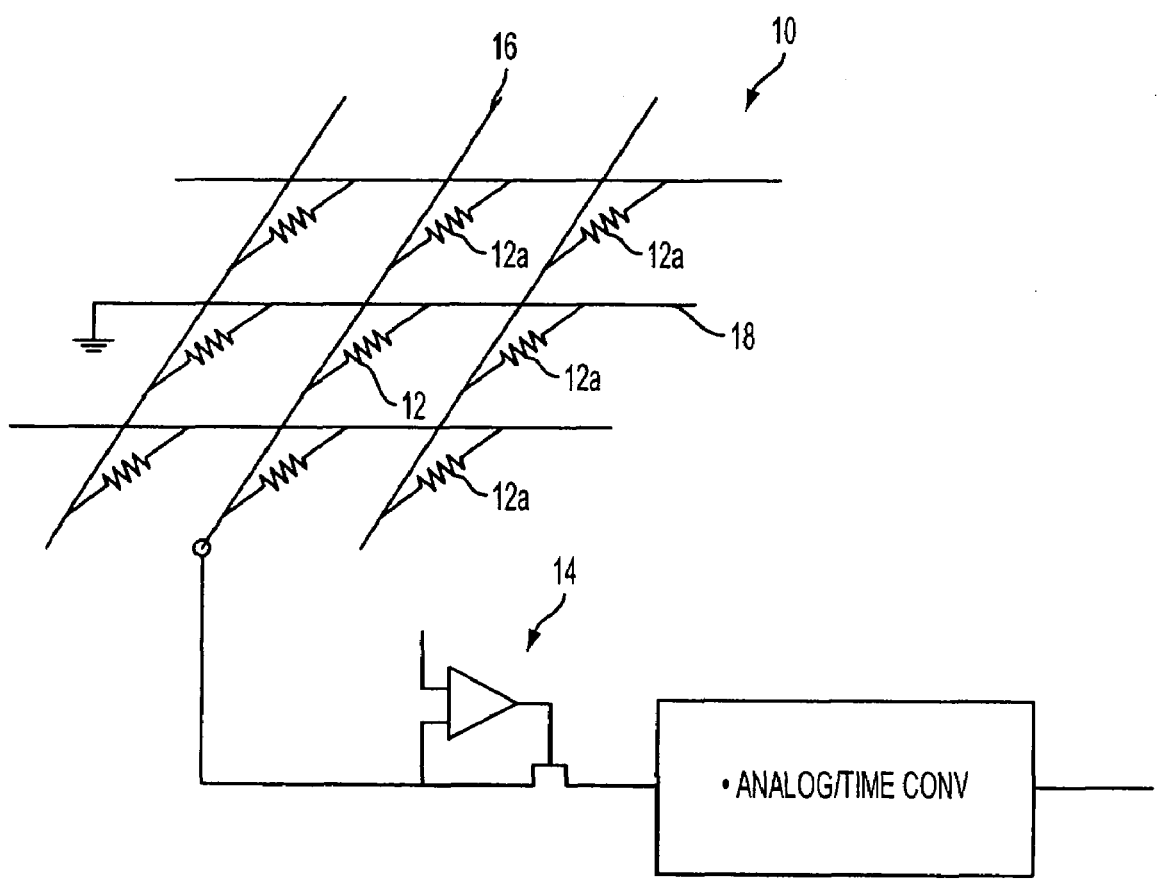
FIG. 1a is an illustration of a cross-point memory array of the prior art.
Figure 1B:
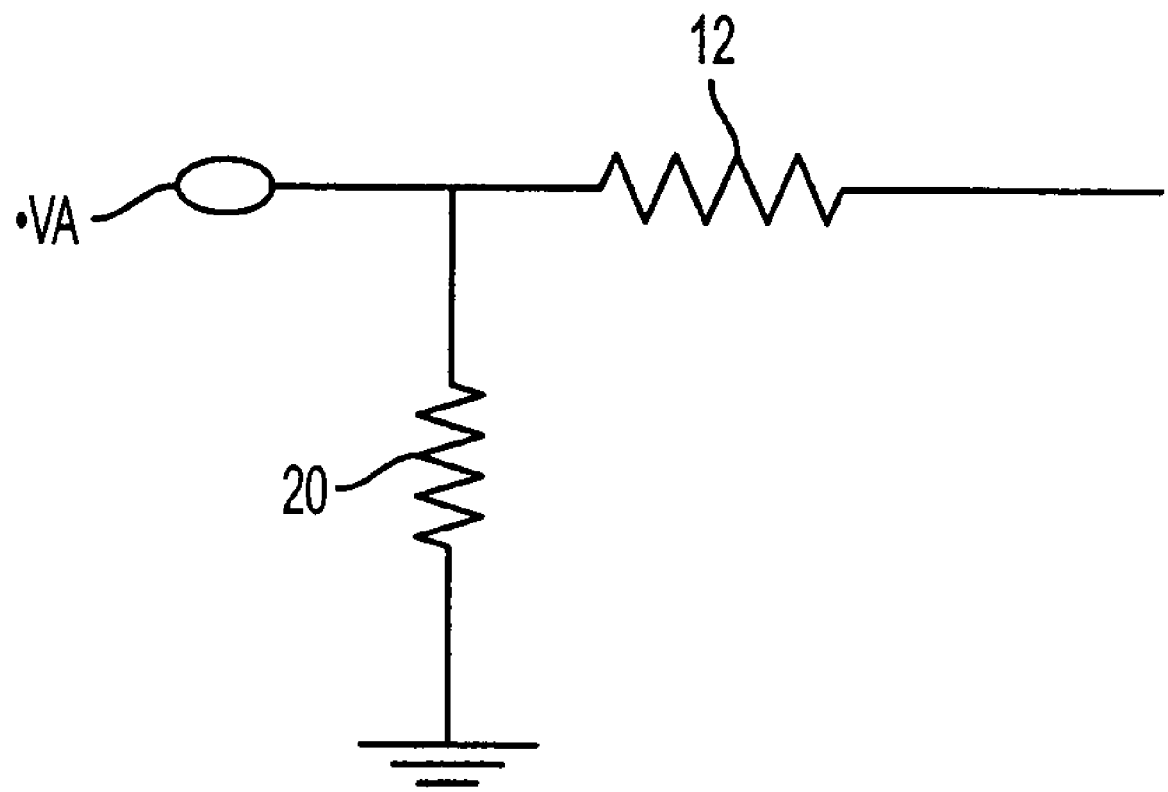
Figure 2A:
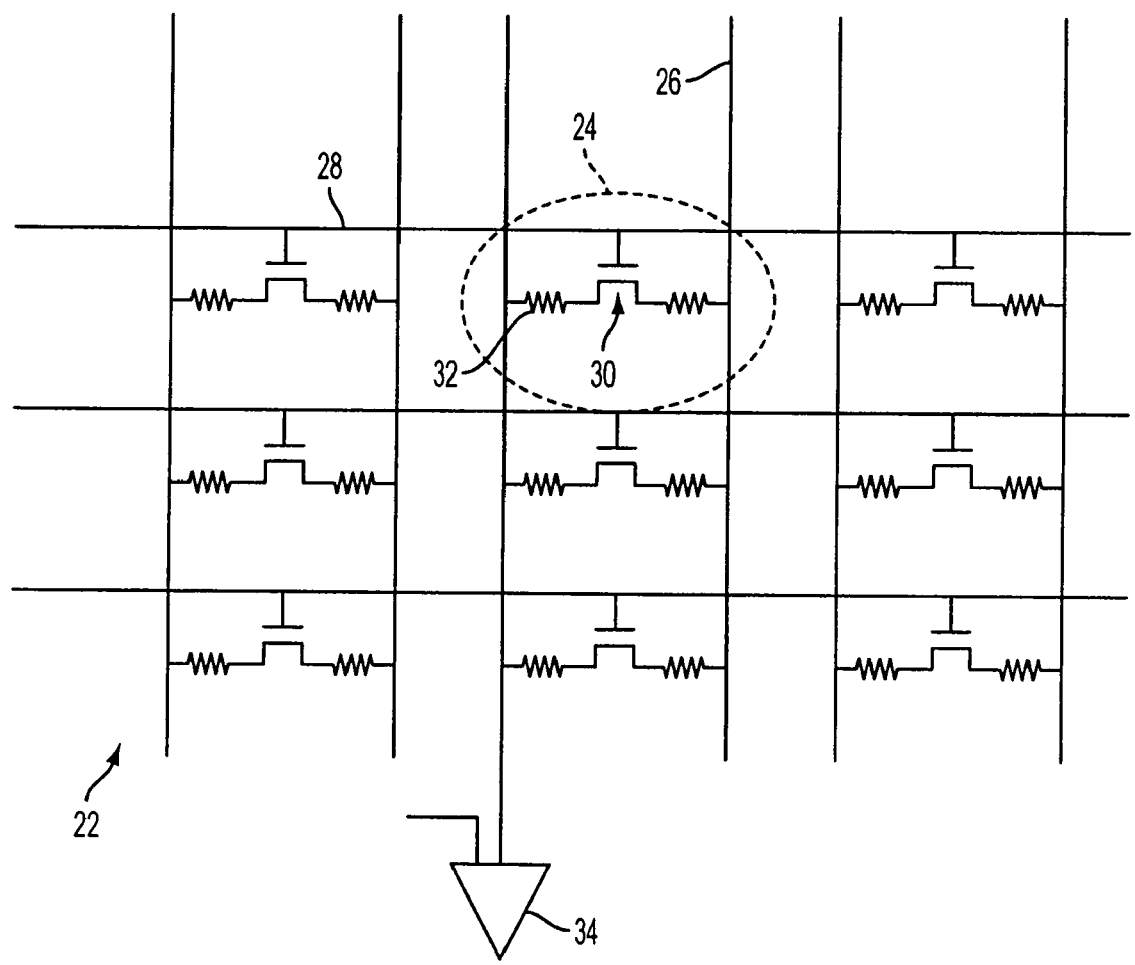
FIG. 2a is an illustration of a portion of an exemplary memory array architecture in accordance with an embodiment of the invention.

Now referring to the drawings, where like reference numbers designate like components of the invention, FIG. 2a shows a portion of a memory array 22 having a memory array architecture in accordance with an exemplary embodiment of the invention. As discussed in the preceding paragraph, the array 22 has memory cells 32, which are grouped into 1T-2nCell blocks 24. "1T-2nCell" indicates that there is an even number (2n) of memory cells 32 per transistor 30 for each block 24, where n memory cells 32 are on each side of the transistor 30. Each memory cell 32 is electrically coupled to a respective bit line 26 and each transistor 30 is electrically coupled to a respective wordline 28. The bit lines 26 are electrically coupled to sense circuitry 34. Thus, FIG. 2a illustrates a 1T-2Cell architecture, in accordance with an embodiment of the invention.

Memory cells 32 of the invention can be MRAM, PCRAM, polymer-based, phase-changing chalcogenide-based, and other non-volatile type memory cells. Such memory cells 32 can be fabricated as is known in the art. Interconnect lines such as wordlines and bit lines can be of materials and can be fabricated as is known in the art. Likewise, transistors used in the invention can be fabricated by processes and with materials as is known in the art.

Figure 2B:
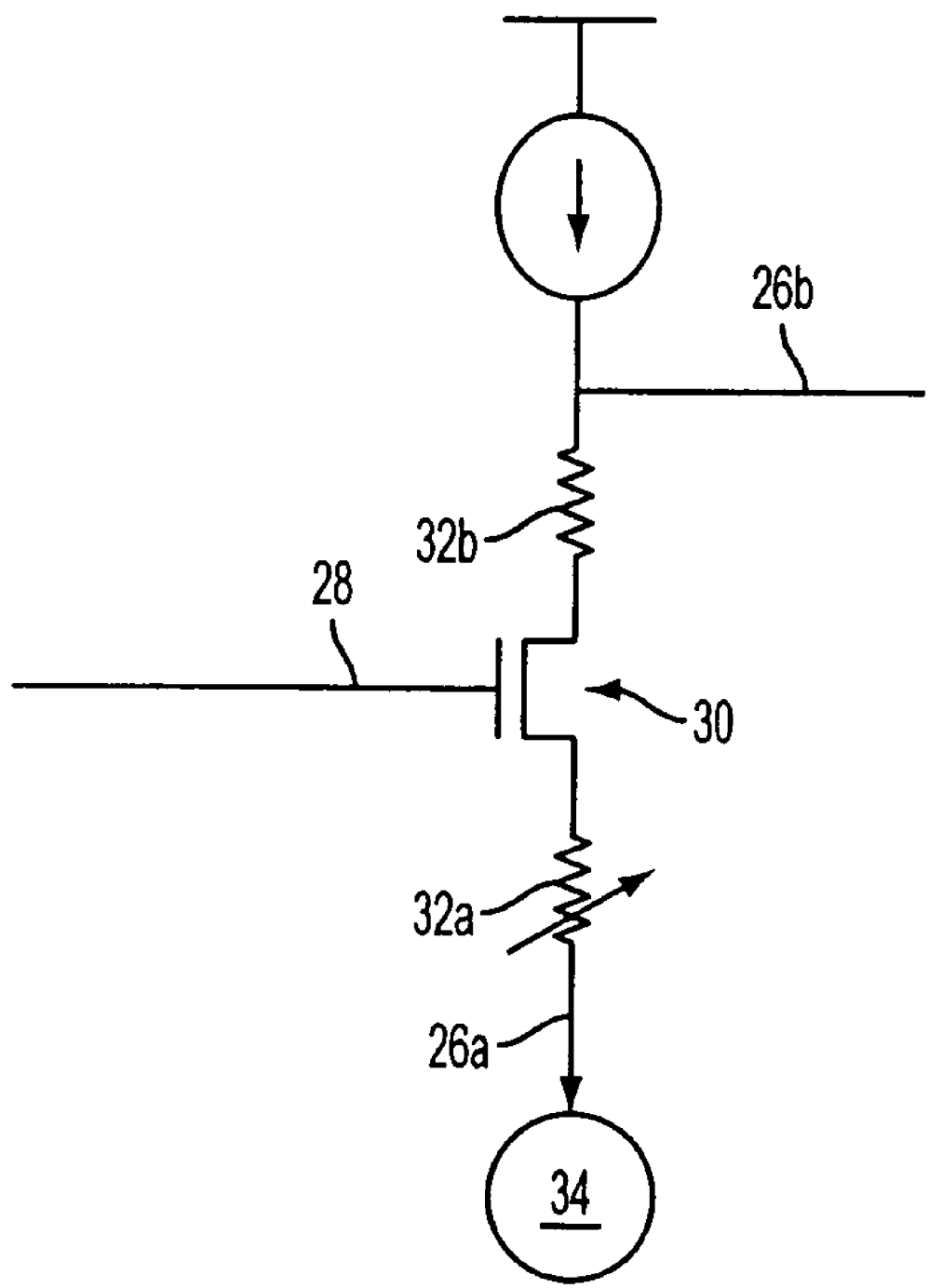
FIG. 2b is a schematic representation of a memory array circuit in accordance with the invention.

Now referring to FIG. 2b, a memory cell 32a can be addressed for reading by grounding the bit line 26a to which it is electrically coupled. Current is forced on a second bit line 26b electrically coupled to a (second) memory cell 32b on the opposite side of the transistor 30 within the memory cell block 24. A suitable (e.g., threshold) voltage is applied to the gate of the transistor 30 to activate the transistor 30. If the memory array 22 (see FIG. 2a) is an MRAM array, the addressed memory cell 32a can be read by changing the resistance state of the cell 32a, as is known in the art, and measuring the resistance change with sensing circuitry 34 electrically coupled to the bit line 26a. Various sensing circuits 34 can be applied as appropriate depending on the specific memory type (e.g., MRAM, PCRAM, polymer memory, chalcogenide memory, or others) of the array 22.

Figure 3:
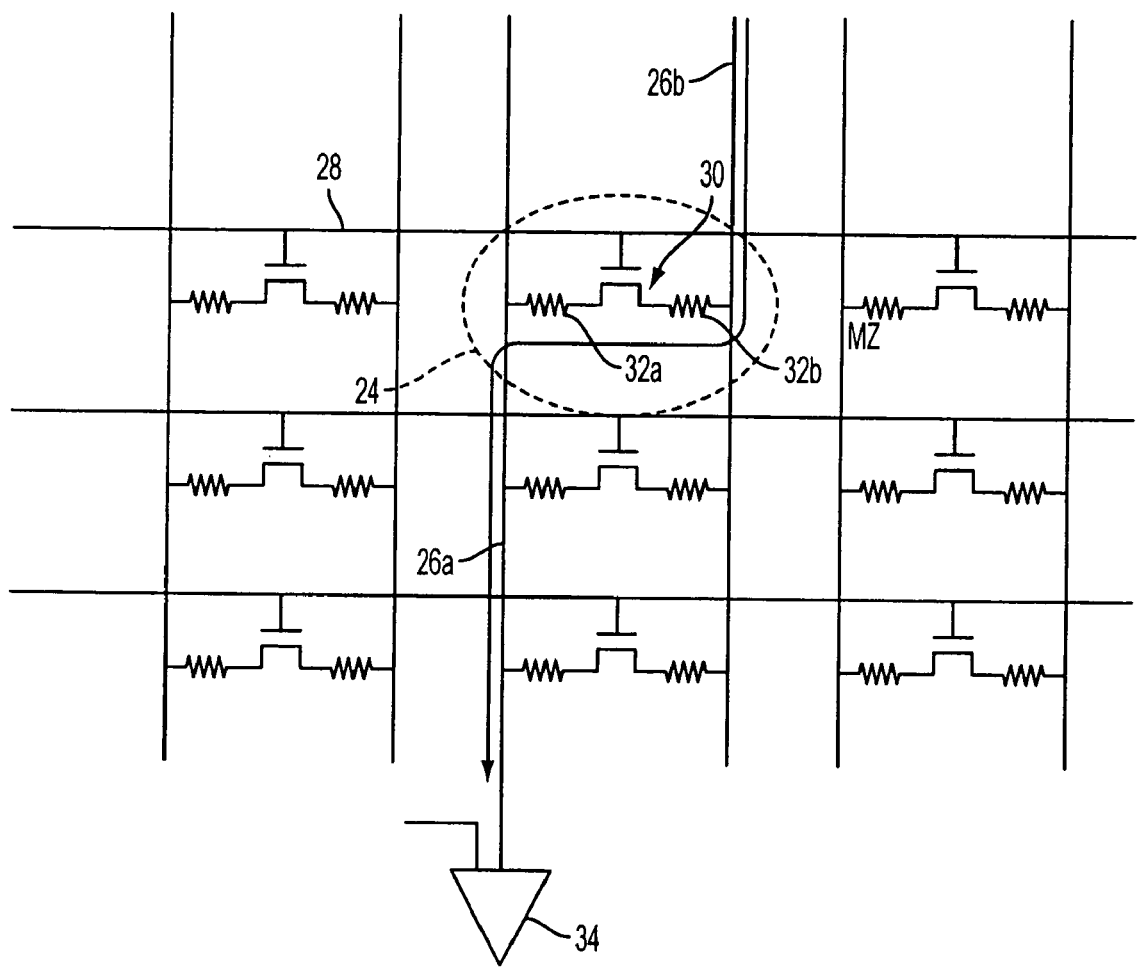
FIG. 3 is an illustration of the memory array architecture of FIGS. 2a and 2b during a read operation.

The addressing and reading operation is also shown in FIG. 3, which depicts an array 22 like that of FIG. 2a. In an architecture such as that shown in FIG. 3 (i.e., 1T-2Cell), there is no sneak path route available to the read circuit because the read circuit does not include any parasitic pathways. Instead, as shown by the arrow 33, current passes directly from the second bit line 26b through the second memory cell 32b, transistor 30, and addressed memory cell 32a, to the first bit line 26a and to the sensing circuit 34. The illustrated architecture would have a relatively large margin of resistivity difference in memory resistivity states. However, it may be desirable to have a denser memory array 22 than would be provided in the illustrated 1T-2Cell architecture (i.e., 1T-2nCell, where n is 1). In such a case, it is also possible to have more than two memory cells 32 (i.e., n>1) on either side of the transistor 30 of the memory cell block 24.

Figure 4A:
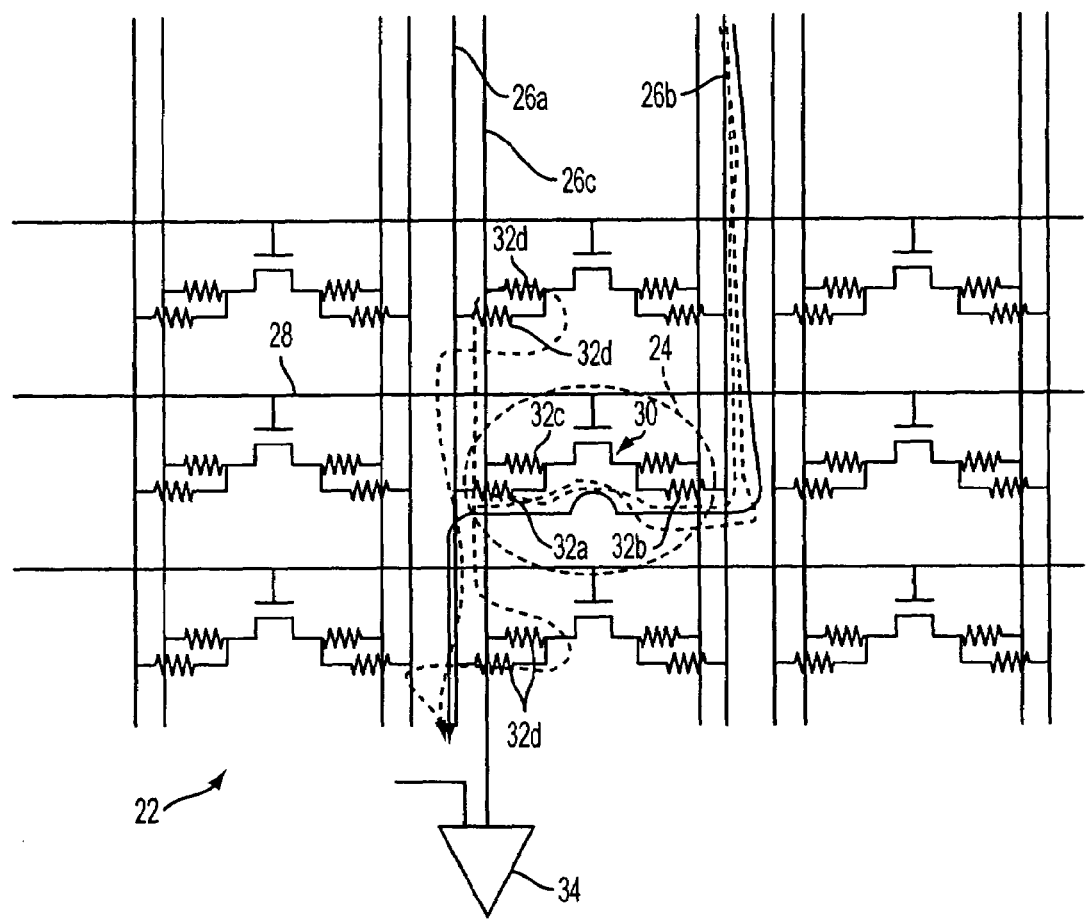
FIG. 4a is an illustration of a portion of an exemplary memory array architecture in accordance with the invention.

Now referring to FIG. 4a, a memory array 122 is shown where more than two memory cells are electrically coupled to either side of the transistor 30 of the memory cell blocks 24. The illustrated array 22 has four memory cells 32 per transistor 30 in a 1T-2nCell architecture, where n is 2 (i.e., 1T-4Cell architecture). In the 1T-4Cell architecture, a specific sneak path 35 (shown in dotted-lines) is created, which has a resistance that can be calculated, as discussed further below. As shown, the two sneak paths 35 combine through any memory cells 32c of the memory cell block 24 electrically coupled to the same side of the transistor 30 as the addressed cell 32a and through sneak memory cells 32d electrically coupled to the bit line 26a electrically coupled to the addressed cell 32a and through any bit line(s) 26c electrically coupled to the memory cell(s) 32c.

Figure 4B:
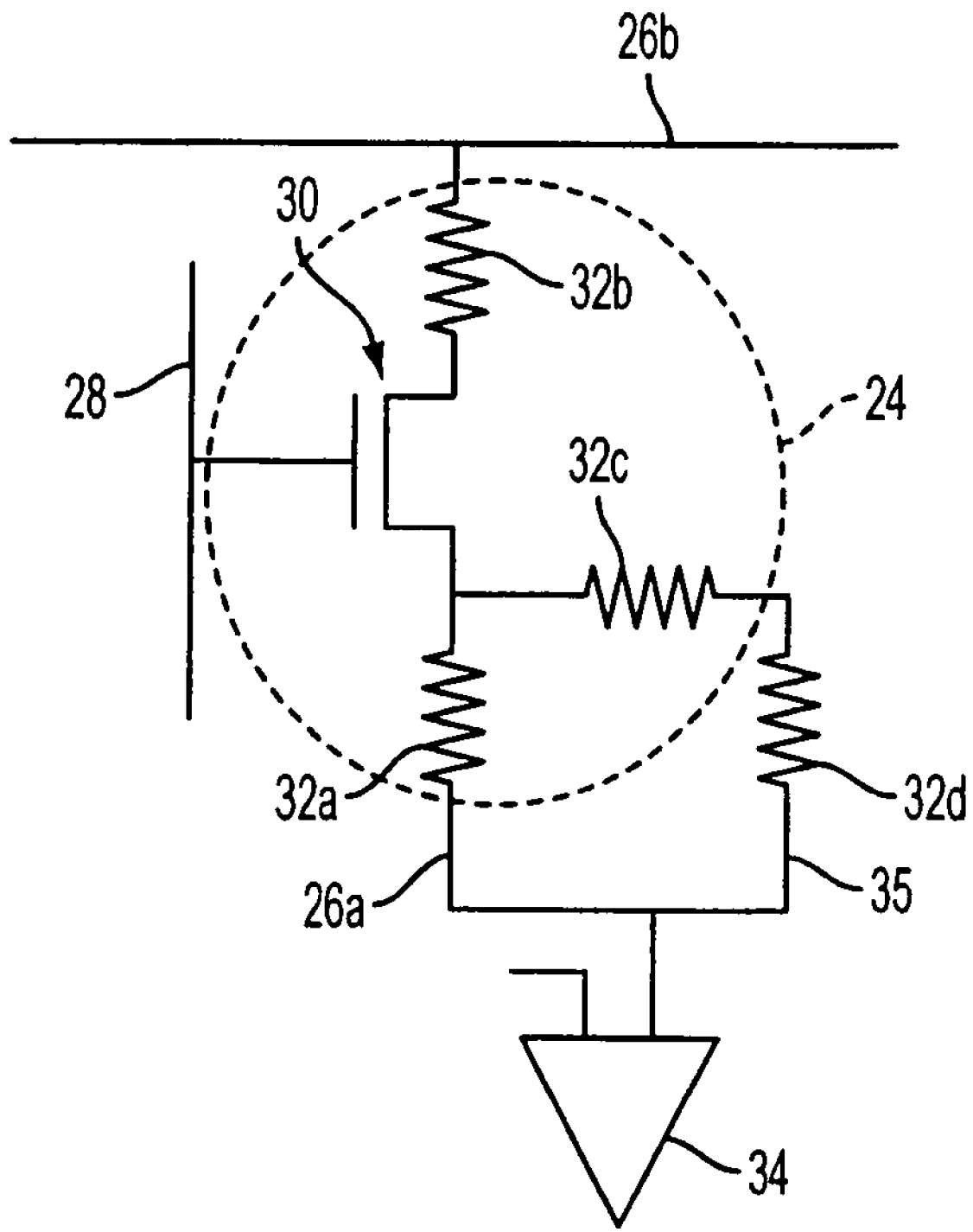

FIG. 4b shows a schematic circuit illustration of an addressed memory cell 32a in a 1T-2nCell architecture, where n can be any even number. The schematic circuit of FIG. 4b can be representational of the circuits of FIGS. 3 and 4a. As shown, the circuit includes bit line 26b, memory cell 32b, transistor 30, the addressed memory cell 32a, and a defined sneak path 35 through memory cells 32c and 32d. The sneak path 35 is in parallel with the addressed memory cell 32a. The illustrated circuit is completed at the sensing circuitry 34. The sneak path 35 is defined by R/(n−1) at memory cell(s) 32c and R/(m(n−1)) at memory cell(s) 32d. R is the combined resistance of the individual memory cells 32c and 32d; n is the number of memory cells 32c of the memory cell block 24 on the same side of the transistor 30 as the addressed memory cell 32a; and m is the total number of rows (equivalent to the number of wordlines 28). Therefore, the resistance of the sneak path 35 can be calculated as:

$$R_{sneak}=[R/(n-1)]+[R/(m(n-1))] \quad (2)$$

This formula can be factored into a read operation. As shown by formula 2, the resistance of the sneak path of the array architecture of the invention can be exponentially greater than that of a comparable cross-point array architecture as exemplified by formula (1) above.

Figure 5:
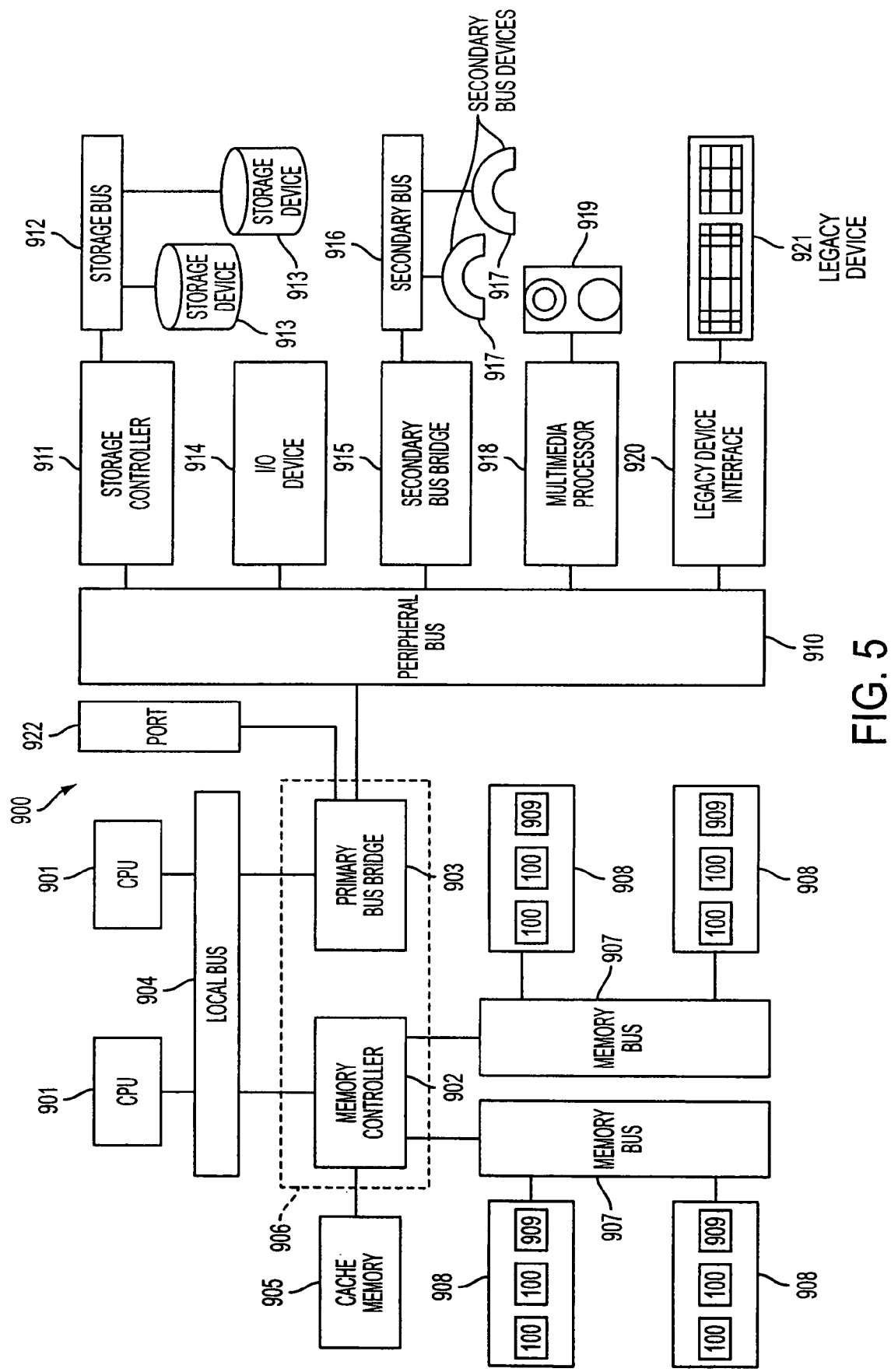
FIG. 5 is a block diagram representation of a processor-based system incorporating a memory device in accordance with the invention.

FIG. 5 illustrates an exemplary processing system 900 which may utilize a memory device 100 having a memory array 22 (FIG. 2a), 122 (FIG. 4a) in accordance with the invention. The processing system 900 includes one or more processors 901 coupled to a local bus 904. A memory controller 902 and a primary bus bridge 903 are also coupled the local bus 904. The processing system 900 may include multiple memory controllers 902 and/or multiple primary bus bridges 903. The memory controller 902 and the primary bus bridge 903 may be integrated as a single device 906.

The memory controller 902 is also coupled to one or more memory buses 907. Each memory bus 907 accepts memory components 908 which include at least one memory device 100 of the present invention. The memory components 908 may be a memory card or a memory module. Examples of memory modules include single inline memory modules (SIMMs) and dual inline memory modules (DIMMs). The memory components 908 may include one or more additional devices 909. For example, in a SIMM or DIMM, the additional device 909 might be a configuration memory, such as a serial presence detect (SPD) memory. The memory controller 902 may also be coupled to a cache memory 905. The cache memory 905 may be the only cache memory in the processing system. Alternatively, other devices, for example, processors 901 may also include cache memories, which may form a cache hierarchy with cache memory 905. If the processing system 900 includes peripherals or controllers which are bus masters or which support direct memory access (DMA), the memory controller 902 may implement a cache coherency protocol. If the memory controller 902 is coupled to a plurality of memory buses 907, each memory bus 907 may be operated in parallel, or different address ranges may be mapped to different memory buses 907.

The primary bus bridge 903 is coupled to at least one peripheral bus 910. Various devices, such as peripherals or additional bus bridges may be coupled to the peripheral bus 910. These devices may include a storage controller 911, a miscellaneous I/O device 914, a secondary bus bridge 915, a multimedia processor 918, and a legacy device interface 920. The primary bus bridge 903 may also coupled to one or more special purpose high speed ports 922. In a personal computer, for example, the special purpose port might be the Accelerated Graphics Port (AGP), used to couple a high performance video card to the processing system 900.

The storage controller 911 couples one or more storage devices 913, via a storage bus 912, to the peripheral bus 910. For example, the storage controller 911 may be a SCSI controller and storage devices 913 may be SCSI discs. The I/O device 914 may be any sort of peripheral. For example, the I/O device 914 may be a local area network interface, such as an Ethernet card. The secondary bus bridge 915 may be used to interface additional devices via another bus to the processing system. For example, the secondary bus bridge 915 may be an universal serial port (USB) controller used to couple USB devices 917 via to the processing system 900. The multimedia processor 918 may be a sound card, a video capture card, or any other type of media interface, which may also be coupled to one additional devices such as speakers 919. The legacy device interface 920 is used to couple legacy devices, for example, older styled keyboards and mice, to the processing system 900.

The processing system 900 illustrated in FIG. 5 is only an exemplary processing system with which the invention may be used in a memory array. While FIG. 5 illustrates a processing architecture especially suitable for a general purpose computer, such as a personal computer or a workstation, it should be recognized that well known modifications can be made to configure the processing system 900 to become more suitable for use in a variety of applications. For example, many electronic devices which require processing may be implemented using a simpler architecture which relies on a CPU 901 coupled to memory components 908 and/or memory devices 100. These electronic devices may include, but are not limited to audio/video processors and recorders, gaming consoles, digital television sets, wired or wireless telephones, navigation devices (including system based on the global positioning system (GPS) and/or inertial navigation), and digital cameras and/or recorders. The modifications may include, for example, elimination of unnecessary components, addition of specialized devices or circuits, and/or integration of a plurality of devices.

The processes and devices described above are merely illustrative of but a few of the preferred methods and typical devices that could be used and produced in accordance with the invention. The above description and drawings illustrate embodiments, which achieve the objects, features, and advantages of the present invention. However, it is not intended that the present invention be strictly limited to the above-described and illustrated embodiments. Any modifications of the present invention that come within the spirit and scope of the following claims should be considered part of the present invention.

What is claimed as new and desired to be protected by Letters Patent of the United States is:

1. An array architecture for a memory device, comprising:
   a memory cell block comprising an even number of memory cells and a transistor, wherein said memory cells are electrically coupled to said transistor such that at least one of the memory cells is on a first side of said transistor and at least one other memory cell is on a second side of said transistor, said memory cells comprising variable resistance memory elements,
   wherein each memory cell is in electrical communication with a respective bit line and upon addressing a first memory cell of said memory cell block a sensed resistance of the first memory cell includes a resistance of any second memory cell of said memory cell block that is electrically coupled to a same side of said transistor as said first memory cell and a resistance of any third memory cell electrically coupled to a same bit line as said first and second memory cells.

2. The array architecture of claim 1, wherein said memory cells comprise PCRAM memory elements.

3. The array architecture of claim 1, wherein said memory cells comprise MRAM memory elements.

4. The array architecture of claim 1, wherein said memory cells comprise polymer memory elements.

5. The array architecture of claim 1, wherein said memory cells comprise phase-changing chalcogenide-based memory elements.

6. The array architecture of claim 1, wherein said memory cells comprise variable resistance memory cells and at least two variable resistance memory cells are electrically coupled to each side of said transistor.

7. A memory device comprising:
   a plurality of memory cell blocks, each block comprising an even number of memory cells and a transistor, wherein said memory cells are electrically coupled to said transistor such that at least one of the memory cells is on a first side of said transistor and at least one other memory cell is on a second side of said transistor, said memory cells comprising variable resistance memory elements,
   wherein each memory cell is in electrical communication with a respective bit line and upon addressing a first memory cell of said memory cell block a sensed resistance of the first memory cell includes a resistance of any second memory cell of said memory cell block that is electrically coupled to a same side of said transistor as said first memory cell and a resistance of any third memory cell electrically coupled to a same bit line as said first and second memory cells.

8. The device of claim 7, wherein said memory cells comprise PCRAM memory elements.

9. The device of claim 7, wherein said memory cells comprise MRAM memory elements.

10. The device of claim 7, wherein said memory cells comprise polymer memory elements.

11. The device of claim 7, wherein said memory cells comprise phase-changing chalcogenide-based memory elements.

12. The device of claim 7, wherein said memory cells comprise variable resistance memory cells and at least two variable resistance memory cells are electrically coupled to each side of said transistor.

13. A processor system, comprising:
   a processor; and
   a memory device coupled to said processor, said memory device comprising:
      a plurality of memory cell blocks, each block comprising an even number of memory cells and a transistor, wherein said memory cells are electrically coupled to said transistor such that at least one of the memory cells is on a first side of said transistor and at least one other memory cell is on a second side of said transistor, said memory cells comprising variable resistance memory elements,
      wherein each memory cell is in electrical communication with a respective bit line and upon addressing a first memory cell of said memory cell block a sensed resistance of the first memory cell includes a resistance of any second memory cell of said memory cell block that is electrically coupled to a same side of said transistor as said first memory cell and a resistance of any third memory cell electrically coupled to a same bit line as said first and second memory cells.

14. The system of claim 13, wherein said memory cells comprise PCRAM memory elements.

15. The system of claim 13, wherein said memory cells comprise MRAM memory elements.

16. The system of claim 13, wherein said memory cells comprise polymer memory elements.

17. The system of claim 13, wherein said memory cells comprise phase-changing chalcogenide-based memory elements.

18. The system of claim 13, wherein said memory cells comprise variable resistance memory cells and at least two variable resistance memory cells are electrically coupled to each side of said transistor.

* * * * *

UNITED STATES PATENT AND TRADEMARK OFFICE
CERTIFICATE OF CORRECTION

PATENT NO. : 7,149,100 B2
APPLICATION NO. : 11/314722
DATED : December 12, 2006
INVENTOR(S) : Hagop A. Nazarian Page 1 of 1

It is certified that error appears in the above-identified patent and that said Letters Patent is hereby corrected as shown below:

In the Specification, the following errors are corrected:

Column 5, lines 53-64, "coupled the" should read --coupled to the--;

Column 6, line 21, "also coupled" should read --also be coupled--;

Column 6, line 35, "an universal' should read --a universal--;

Column 6, line 36, "via to the" should read --via the--;

Column 6, line 39, "to one additional" should read --to additional--; and

Column 6, line 57, "system" should read --systems--.

Signed and Sealed this

Sixth Day of March, 2007

JON W. DUDAS
*Director of the United States Patent and Trademark Office*